United States Patent
Ichikawa et al.

(10) Patent No.: US 10,714,977 B2
(45) Date of Patent: Jul. 14, 2020

(54) VOLTAGE DETECTION CIRCUIT, POWER TRANSMISSION DEVICE, AND POWER TRANSMISSION SYSTEM

(71) Applicant: MURATA MANUFACTURING CO., LTD., Kyoto-fu (JP)

(72) Inventors: Keiichi Ichikawa, Nagaokakyo (JP); Tsuyoshi Suesada, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/654,341

(22) Filed: Jul. 19, 2017

(65) Prior Publication Data
US 2017/0315159 A1    Nov. 2, 2017

Related U.S. Application Data

(63) Continuation of application No. PCT/JP2016/054642, filed on Feb. 18, 2016.

(30) Foreign Application Priority Data

Feb. 26, 2015  (JP) ................. 2015-036764

(51) Int. Cl.
*H02M 7/06* (2006.01)
*H02J 50/12* (2016.01)
(Continued)

(52) U.S. Cl.
CPC .............. *H02J 50/12* (2016.02); *G01R 15/06* (2013.01); *H02J 7/025* (2013.01); *H02J 7/04* (2013.01); *G01R 15/144* (2013.01)

(58) Field of Classification Search
CPC . H02M 2007/4815; H02M 2007/4818; H02M 7/4826; H02M 7/06; H02M 7/066; H02J 50/12; H02J 50/10; H02J 50/50
See application file for complete search history.

(56) References Cited

U.S. PATENT DOCUMENTS 9,231,412 B2 *  1/2016  Lisi et al. ......... H02M 3/33592
9,685,794 B2 *  6/2017  Takahashi ............... H02J 5/005
(Continued)

FOREIGN PATENT DOCUMENTS

| JP | H06-003374 A | 1/1994 |
| JP | H08-248086 A | 9/1996 |

(Continued)

OTHER PUBLICATIONS

International Search Report issued in PCT/JP2016/054642; dated May 10, 2016.
Written Opinion issued in PCT/JP2016/054642; dated May 10, 2016.

*Primary Examiner* — Thienvu V Tran
*Assistant Examiner* — Sisay G Tiku
(74) *Attorney, Agent, or Firm* — Studebaker & Brackett PC (57) ABSTRACT

A voltage detection circuit includes an inductor connected to connection portions configured to input an alternating-current voltage, an inductor magnetic-field coupled to the inductor, a capacitor connected in parallel to the inductor and constituting a secondary-side resonant circuit with the inductor, and a voltage detector configured to detect an output voltage from the secondary-side resonant circuit. Therefore, a voltage detection circuit, a power transmission device, and a power transmission system capable of detecting an alternating-current voltage with high detection sensitivity irrespective of the potential of a power transmission line are provided.

12 Claims, 9 Drawing Sheets

(51) Int. Cl.
*H02J 50/50* (2016.01)
*G01R 15/06* (2006.01)
*H02J 7/02* (2016.01)
*H02J 7/04* (2006.01)
*G01R 15/14* (2006.01)

(56) References Cited

U.S. PATENT DOCUMENTS

| | | | | |
|---|---|---|---|---|
| 9,698,629 | B2* | 7/2017 | Ichikawa | H02J 50/40 |
| 9,831,917 | B2* | 11/2017 | Ichikawa | H04B 5/0012 |
| 9,853,460 | B2* | 12/2017 | Ichikawa | H02J 5/005 |
| 10,340,743 | B2* | 7/2019 | Takatsu | H02J 50/90 |
| 10,340,805 | B2* | 7/2019 | Kovacevic | H02M 1/4241 |
| 2006/0209576 | A1* | 9/2006 | Yasumura | H02M 3/3385 363/22 |
| 2007/0076443 | A1* | 4/2007 | Yasumura | H02M 1/34 363/16 |
| 2007/0081365 | A1* | 4/2007 | Yasumura | H02M 3/3381 363/21.02 |
| 2009/0184950 | A1* | 7/2009 | Furuta | H02J 50/12 345/211 |
| 2010/0084918 | A1* | 4/2010 | Fells et al. | H02M 3/33592 |
| 2010/0176659 | A1* | 7/2010 | Aoyama et al. | H02M 3/33592 |
| 2013/0300210 | A1* | 11/2013 | Hosotani | H02J 5/005 307/104 |
| 2013/0301306 | A1* | 11/2013 | Hosotani | H02M 3/338 363/21.02 |
| 2013/0301308 | A1* | 11/2013 | Hosotani | H02M 3/3381 363/21.03 |
| 2014/0268899 | A1* | 9/2014 | Hosotani | H02M 3/33569 363/17 |
| 2014/0285016 | A1* | 9/2014 | Tetu | H02J 7/0027 307/31 |
| 2015/0194814 | A1* | 7/2015 | Taylor et al. | H02M 3/33592 |
| 2015/0236518 | A1* | 8/2015 | Matsumoto et al. | H02M 3/33592 |
| 2015/0276965 | A1* | 10/2015 | Turki | B60L 11/182 324/207.17 |
| 2016/0001085 | A1* | 1/2016 | Pan | A61N 1/3787 607/60 |
| 2016/0028241 | A1* | 1/2016 | Ichikawa | B60L 11/182 307/9.1 |
| 2016/0049825 | A1* | 2/2016 | Green | H02J 7/025 320/108 |
| 2016/0164307 | A1* | 6/2016 | Shibata et al. | H02M 3/33592 |
| 2016/0218520 | A1* | 7/2016 | Mehas | H02J 50/12 |
| 2016/0218559 | A1* | 7/2016 | Mehas | H02J 50/60 |
| 2017/0110912 | A1* | 4/2017 | Ichikawa | H02J 50/10 |
| 2017/0129347 | A1* | 5/2017 | Kotani | H02J 50/90 |
| 2018/0035501 | A1* | 2/2018 | Motomura | H02M 1/42 |

FOREIGN PATENT DOCUMENTS

| | | |
|---|---|---|
| JP | 2006-060909 A | 3/2006 |
| JP | 2008-236917 A | 10/2008 |

* cited by examiner

VOLTAGE DETECTION CIRCUIT, POWER TRANSMISSION DEVICE, AND POWER TRANSMISSION SYSTEM

CROSS REFERENCE TO RELATED APPLICATIONS

This application claims benefit of priority to Japanese Patent Application 2015-036764 filed Feb. 26, 2015, and to International Patent Application No. PCT/JP2016/054642 filed Feb. 18, 2016, the entire content of which is incorporated herein by reference.

TECHNICAL FIELD

The present disclosure relates to a voltage detection circuit for detecting an alternating-current voltage, a power transmission device including it and wirelessly transmitting power to a power reception device, and a power transmission system including it.

BACKGROUND

Japanese Unexamined Patent Application Publication No. 2006-60909 discloses a power transmission system using magnetic-field coupling and detecting whether a foreign object is on a coupling coil on a power transmission side. The power transmission system described in Japanese Unexamined Patent Application Publication No. 2006-60909 includes a power transmission device, detects a voltage applied to the coupling coil in the power transmission device, and detects the presence or absence of a foreign object on the basis of fluctuations in the detected voltage.

SUMMARY

Technical Problem

The power transmission device described in Japanese Unexamined Patent Application Publication No. 2006-60909 is a differential circuit, and it includes a voltage divider disposed between one of power transmission lines and the ground in order to detect a voltage of the coupling coil and detects the voltage. With the voltage detecting method described in Japanese Unexamined Patent Application Publication No. 2006-60909, if the differential voltage is asymmetrical, there is a problem that an error is present between the detected voltage and an actual voltage applied across the coupling coil and thus the detection accuracy is low. The voltage detecting method described in Japanese Unexamined Patent Application Publication No. 2006-60909 also suffers from a problem that only the potential in one of the power transmission lines is detected and the differential voltage applied across the coupling coil is not measured.

Accordingly, it is an object of the present disclosure to provide a voltage detection circuit, a power transmission device, and a power transmission system capable of detecting an alternating-current voltage with high detection sensitivity irrespective of the potential of a power transmission line.

Solution to Problem

A voltage detection circuit according to the present disclosure includes a pair of input terminals configured to input an alternating-current voltage, a primary-side inductor connected to the pair of input terminals, a secondary-side inductor magnetic-field coupled to the primary-side inductor, a secondary-side capacitor connected in parallel to the secondary-side inductor, the secondary-side capacitor and the secondary-side inductor constituting a secondary-side resonant circuit, and an output voltage detector configured to detect an output voltage from the secondary-side resonant circuit.

In this configuration, when an alternating-current voltage is applied to the primary-side inductor, a voltage is induced in the secondary-side inductor, and the alternating-current voltage applied to the primary-side inductor can be estimated (calculated) by detecting the induced voltage. To detect a potential difference (differential voltage) between two power transmission lines, connection of the primary-side inductor between the two power transmission lines enables estimating the alternating-current voltage (differential voltage) applied to the primary-side inductor. In this case, it is not necessary to detect the potential of each of the two power transmission lines with reference to the reference potential (ground) of the circuitry and then perform processing, such as subtraction, and the potential difference (differential voltage) between the two power transmission lines can be directly detected. To detect a potential difference (differential voltage) between a line and the reference potential (ground), connection of the primary-side inductor between the signal line and the reference potential enables estimating the alternating-current voltage applied to the primary-side inductor. That is, the voltage detection circuit according to the present disclosure can detect the voltage with the same configuration irrespective of whether lines are differential lines or not (whether one side of a power transmission line is grounded or not). By making the resonant frequency of the secondary-side resonant circuit close to the frequency of the alternating-current voltage to be detected, the output voltage from the secondary-side resonant circuit can be raised, and the sensitivity to detect the voltage can be enhanced.

In the present disclosure, the resonant frequency of the secondary-side resonant circuit may preferably be a frequency of the alternating-current voltage input from the pair of input terminals.

In this configuration, harmonic components that would be error factors can be reduced, and the measurement accuracy can be enhanced.

The voltage detection circuit according to the present disclosure may preferably further include a primary-side capacitor connected in parallel to the primary-side inductor, and the primary-side inductor and the primary-side capacitor may preferably constitute a primary-side resonant circuit.

In this configuration, because of the presence of the primary-side capacitor, the voltage can be detected with stability.

In the voltage detection circuit according to the present disclosure, a resonant frequency of the primary-side resonant circuit may preferably be a frequency of the alternating-current voltage input into the pair of input terminals.

In this configuration, a high voltage can be induced in the secondary-side inductor.

In the voltage detection circuit according to the present disclosure, the resonant frequency of the primary-side resonant circuit may preferably be equal to the resonant frequency of the secondary-side resonant circuit.

In this configuration, the frequency characteristics in the vicinity of the driving frequency can be flattened by using combination resonance.

In the present disclosure, the frequency of the alternating-current voltage input into the pair of input terminals may preferably be equal to or between two resonant frequencies defined by the primary-side resonant circuit and the secondary-side resonant circuit.

In this configuration, the alternating-current voltage can be detected over a wide frequency range with stability.

In the present disclosure, the degree of coupling between the primary-side inductor and the secondary-side inductor may preferably be set such that the two resonant frequencies differ from a harmonic frequency.

In this configuration, harmonics can be attenuated, errors caused by the harmonics can be reduced, and the measurement accuracy can be enhanced.

The voltage detection circuit according to the present disclosure may preferably further include an impedance element connected in series between each of the pair of input terminals and the primary-side inductor.

In this configuration, a higher voltage can be measured by causing the series impedance to share the voltage between the pair of input terminals.

In the voltage detection circuit according to the present disclosure, the impedance element may preferably be a capacitor.

In this configuration, the use of the capacitor enables maintaining direct-current insulation between main lines connected to the pair of input terminals and the voltage detection circuit. Because a direct-current voltage is not applied between the primary-side inductor and the secondary-side inductor, stresses based on the direct-current voltage can be reduced, and reliability of insulation between the inductors can be increased.

The present disclosure provides a power transmission device including a power transmission coupling portion and transmitting power to a power reception device by causing a power reception coupling portion included in the power reception device and the power transmission coupling portion to be coupled to each other by at least one of electric fields and magnetic fields. The power transmission device further includes an inverter circuit configured to convert a direct-current voltage into an alternating-current voltage and output the alternating-current voltage to the power transmission coupling portion, a resonant circuit including the power transmission coupling portion and disposed between the inverter circuit and the power transmission coupling portion, the voltage detection circuit according to the present disclosure disposed between the inverter circuit and the power transmission coupling portion, and a status detector configured to detect a status of a side on which the power transmission coupling portion is disposed on the basis of the voltage detected by the voltage detection circuit.

In this configuration, a status, such as whether the power reception device is placed on the power transmission device or not, where it is placed, how the load fluctuates, or the presence or absence of an abnormal condition, can be detected, and the status can be assessed.

The power transmission device according to the present disclosure may preferably further include an impedance detector configured to detect an impedance as seen from the inverter circuit to the power transmission coupling portion on the basis of the voltage detected by the voltage detection circuit, and the status detector may preferably be configured to detect the status of the side on which the power transmission coupling portion is disposed on the basis of the impedance detected by the impedance detector.

In this configuration, the status, such as whether the power reception device is placed on the power transmission device or not, where it is placed, how the load fluctuates, or the presence or absence of an abnormal condition, can be detected, and the status can be assessed on the basis of the detected impedance value (fluctuations).

In the power transmission device according to the present disclosure, the voltage detection circuit may preferably be configured to detect a voltage between differential lines (balanced lines).

In the power transmission device according to the present disclosure, the power transmission coupling portion may preferably be a coil magnetic-field coupled to the power reception coupling portion.

A power transmission system according to the present disclosure includes the power transmission device according to the present disclosure and a power reception device including the power reception coupling portion and a rectifying and smoothing circuit. The power reception coupling portion is coupled to the power transmission coupling portion by at least one of electric fields and magnetic fields. The rectifying and smoothing circuit is configured to rectify and smooth a voltage induced in the power reception coupling portion and output the voltage to a load.

In this configuration, a status, such as whether the power reception device is placed on the power transmission device or not, where it is placed, how the load fluctuates, or the presence or absence of an abnormal condition, can be detected, and the status can be assessed.

Advantageous Effects of Disclosure

According to the present disclosure, voltage can be detected with the same configuration irrespective of whether lines are differential lines or not (one side of a power transmission line is grounded or not). By making a resonant frequency of a secondary-side resonant circuit close to a frequency of an alternating-current voltage to be detected, the sensitivity to detect the voltage can be enhanced.

DETAILED DESCRIPTION

First Embodiment

Figure 1:
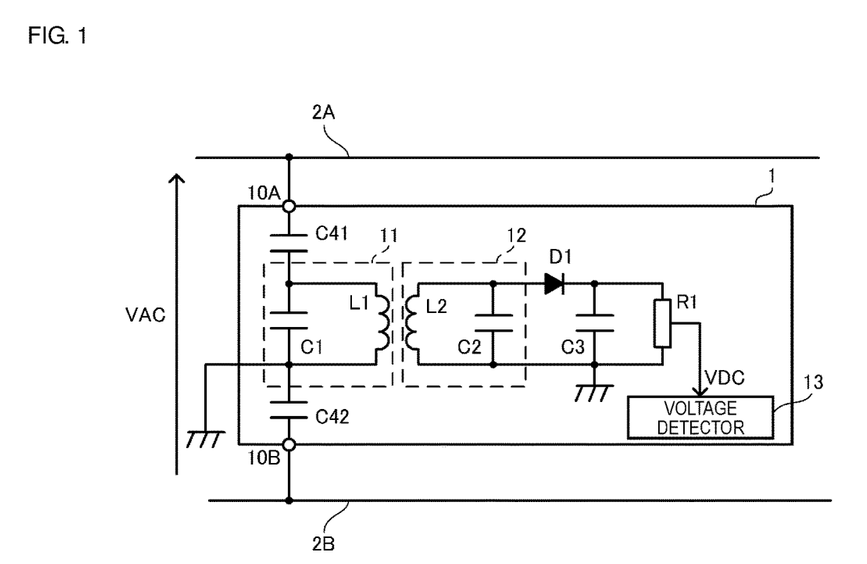
FIG. 1 is a circuit diagram of a voltage detection circuit according to a first embodiment.

FIG. 1 is a circuit diagram of a voltage detection circuit 1 according to a first embodiment.

The voltage detection circuit 1 detects a potential difference (differential voltage) VAC between two power transmission lines 2A and 2B through which an alternating current signal passes. The voltage detection circuit 1 includes connection portions 10A and 10B. The connection portion 10A is connected to the power transmission line 2A. The connection portion 10B is connected to the power transmission line 2B. The voltage detection circuit 1 receives an alternating-current voltage occurring in the power transmission lines 2A and 2B from the connection portions 10A and 10B. The voltage detection circuit 1 detects (estimates) the differential voltage VAC between the power transmission lines 2A and 2B by detecting the input alternating-current voltage. The connection portions 10A and 10B are an example of "pair of input terminals" according to the present disclosure. In the case where one side is grounded, the voltage detection circuit 1 can also similarly detect an alternating-current component of the potential difference occurring between the power transmission lines 2A and 2B.

The voltage detection circuit 1 includes capacitors C41 and C42. The capacitors C41 and C42 are connected in series between the connection portions 10A and 10B. The capacitors C41 and C42 have the same capacitance and divide the alternating-current voltage input from the connection portions 10A and 10B. The capacitors C41 and C42 are an example of "impedance element" according to the present disclosure.

The voltage detection circuit 1 includes a primary-side resonant circuit 11 and a secondary-side resonant circuit 12. The primary-side resonant circuit 11 is disposed between the capacitors C41 and C42. By the arrangement of the capacitors C41 and C42 between the primary-side resonant circuit 11 and the power transmission lines 2A and 2B, the primary-side resonant circuit 11 and the power transmission lines 2A and 2B are separated and insulated from each other, and the effects on the power transmission lines 2A and 2B from the resonant circuits 11 and 12 are reduced. As described in detail below, the constants of each of the resonant circuits 11 and 12 are set such that its frequency matches with a frequency of an alternating-current voltage occurring in the power transmission lines 2A and 2B, and they resonate while coupling (resonate in combination). When the alternating-current voltage input from the connection portions 10A and 10B and divided by the capacitors C41 and C42 is input into the primary-side resonant circuit 11, an alternating-current voltage is induced in the secondary-side resonant circuit 12 by magnetic-field coupling. The secondary-side resonant circuit 12 is connected to a rectifying and smoothing circuit including a diode D1 and a capacitor C3. The alternating-current voltage output from the secondary-side resonant circuit 12 is rectified and smoothed by the rectifying and smoothing circuit, and it is applied to a load R1.

The voltage detection circuit 1 includes a voltage detector 13. The voltage detector 13 detects a voltage across the load R1 (hereinafter referred to as across voltage VDC). The magnitude of the differential voltage VAC between the power transmission lines 2A and 2B is detected from the across voltage VDC. Correction and conversion can be performed using the correlation between the differential voltage VAC and the across voltage VDC, as appropriate. The voltage detector 13 is an example of "output voltage detector" according to the present disclosure.

The primary-side resonant circuit 11 and the secondary-side resonant circuit 12 are described in detail below.

The primary-side resonant circuit 11 includes a capacitor C1 and an inductor L1. The capacitor C1 is disposed between the capacitors C41 and C42. The inductor L1 is connected in parallel to the capacitor C1. The capacitor C1 is an example of "primary-side capacitor" according to the present disclosure. The inductor L1 is an example of "primary-side inductor" according to the present disclosure.

Because the connection line of the inductor L1 deviates from a reference potential in terms of direct current, the inductor L1 is connected to the reference potential in FIG. 1. In FIG. 1, one end of the capacitor C1 is connected to the reference potential. The capacitor C1 may be divided in two portions, and its midpoint may be connected to the reference potential. The primary-side circuit can be symmetrical, and the balance in the balanced circuit can be maintained. The inductor L1 may be connected to the reference potential with a resistor having high resistance (e.g., 100 kΩ) with respect to a reactance of divided capacitance, a midpoint of the inductor L1, or the like disposed therebetween. This can avoid the effects of charging a conductor included in the inductor L1.

The secondary-side resonant circuit 12 includes an inductor L2 and a capacitor C2. The inductor L2 is magnetic-field coupled to the inductor L1. The capacitor C2 is connected in parallel to the inductor L2. The capacitor C2 is an example of "secondary-side capacitor" according to the present disclosure. The inductor L2 is an example of "secondary-side inductor" according to the present disclosure.

A resonant frequency of the resonant circuits 11 and 12 is set so as to match with the frequency of the alternating-current voltage occurring in the power transmission lines 2A and 2B. Here, "matching" is not restricted to exactly matching. When the resonant frequency of the resonant circuits 11 and 12 is close to the frequency of the alternating-current voltage, the voltage detection sensitivity of the voltage detector 13 increases. This voltage detection sensitivity may preferably be approximately twice that when the resonant circuits 11 and 12 are not used. Specifically, the resonant frequency of the resonant circuits 11 and 12 may preferably be in a range of ±25% of the frequency of the alternating-current voltage, and in such cases the two frequencies are considered to "match."

The capacitance of each of the capacitors C41 and C42 may preferably be small enough not to affect the resonant characteristics of the resonant circuits 11 and 12. For example, the capacitance of each of the capacitors C41 and C42 may be at or below ⅕ of that of the capacitor C1 in the primary-side resonant circuit 11. To separate and insulate the resonant circuits 11 and 12, the parasitic capacitance between the resonant circuits 11 and 12 may preferably be small.

By causing the magnetic-field coupled resonant circuits and 12 to resonate in combination and detecting a voltage applied from the primary side at the secondary side, the alternating-current voltage can be detected over a wide frequency range with stability while at the same time achieving high voltage detection sensitivity.

Figure 2:
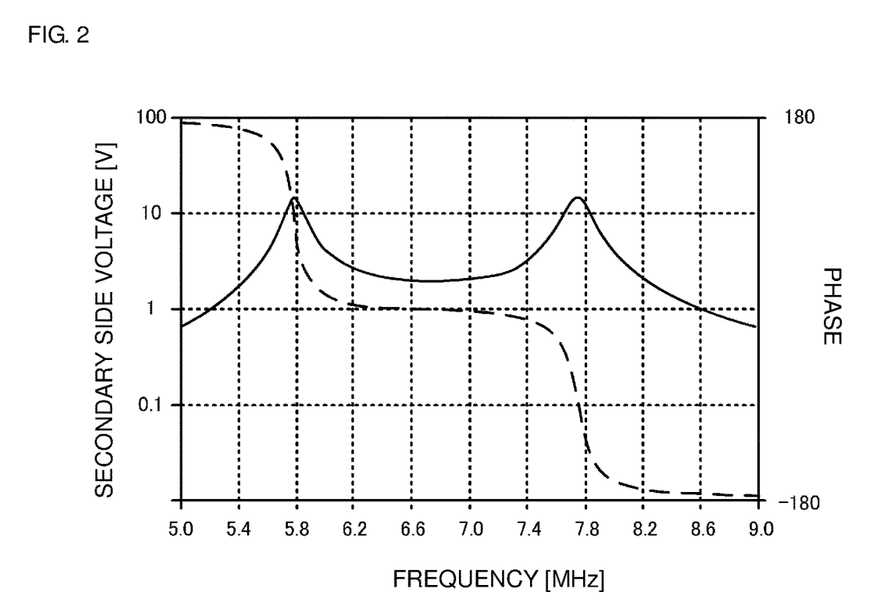
FIG. 2 illustrates frequency characteristics of an output voltage on a secondary side.
Figure 3:
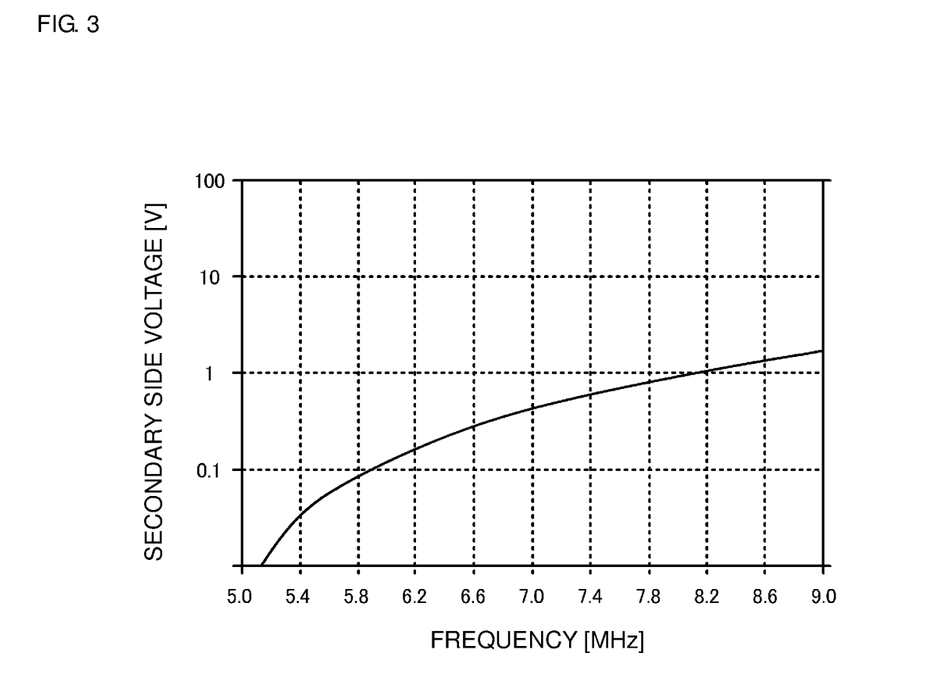
FIG. 3 illustrates frequency characteristics of the output voltage on the secondary side when resonance is not used.

FIG. 2 illustrates frequency characteristics of an output voltage on the secondary side. FIG. 3 illustrates frequency characteristics of the output voltage on the secondary side when resonance is not used. FIG. 3 is provided for comparison with FIG. 2. The horizontal axis in each of FIGS. 2 and 3 indicates the frequency, and the vertical axis therein indicates the sensitivity (voltage on the secondary side when the voltage on the primary side is 100 V). A resonant frequency of the primary-side resonant circuit 11 and the secondary-side resonant circuit 12 is 6.78 MHz (hereinafter this frequency is referred to as fundamental).

Comparison between FIGS. 2 and 3 reveals that in the vicinity of 6.78 MHz, the configuration illustrated in FIG. 2, which uses combination resonance, obtains higher sensitivity. That is, the configuration using combination resonance obtains a higher voltage on the secondary side (output voltage). When the primary-side resonant circuit 11 and the secondary-side resonant circuit 12 are made to resonate in combination, as illustrated in FIG. 2, two resonance points near 5.8 MHz and 7.8 MHz are present. The sensitivity is substantially constant between these two reference points (between 6.2 MHz and 7.4 MHz). The use of this frequency range enables the frequency characteristics in the vicinity of the driving frequency (6.78 MHz) to be flattened even when the frequency of an alternating-current voltage to be detected fluctuates, and thus the voltage can be detected with stability.

In FIG. 2, the phase characteristics of the alternating-current voltage are indicated by a broken line. The phase characteristics are also substantially constant between the two resonance points (between 6.2 MHz and 7.4 MHz). That is, the phase detection accuracy can also be increased by using the circuit configuration according to the present embodiment.

When the primary-side resonant circuit 11 and the secondary-side resonant circuit 12 are made to resonate in combination, the combination resonant frequencies (two resonant frequencies) are set at values different from harmonic frequencies. Specifically, the combination resonant frequencies satisfy the conditions that both are below a second-order harmonic (13.56 MHz) and do not lead to amplification of harmonic components (second-order harmonic, third-order harmonic, . . . ) caused by an error factor.

Figure 4:
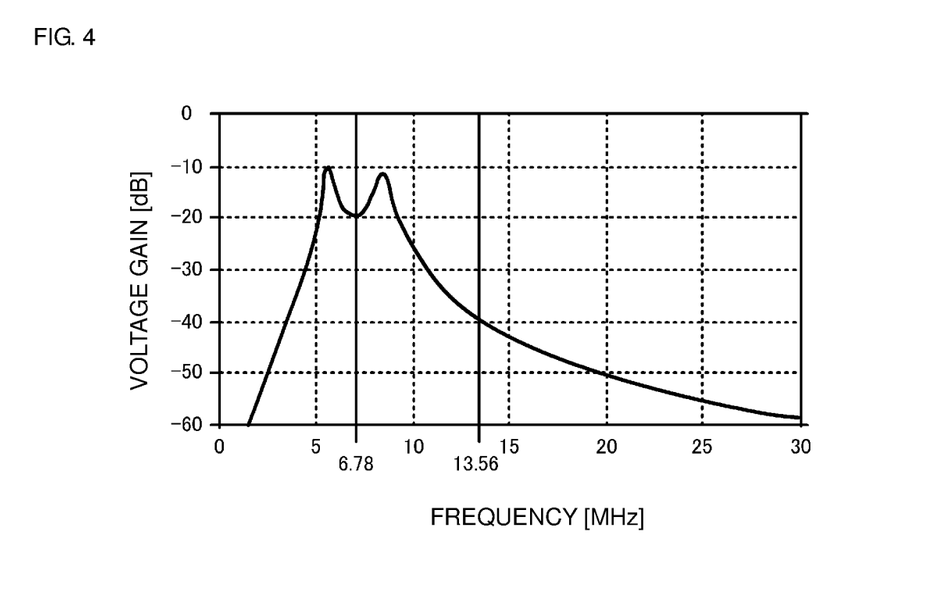
FIG. 4 illustrates frequency characteristics of a voltage gain.

FIG. 4 illustrates frequency characteristics of a voltage gain. The voltage gain is a ratio between an input voltage on the primary side and an output voltage on the secondary side. In this example, the degree of coupling (coupling coefficient) between the primary-side inductor and the secondary-side inductor is approximately 0.4. In this case, the voltage gain (approximately −40 dB) for the second-order harmonic (13.56 MHz) is lower than the voltage gain (approximately −20 dB) for the fundamental (6.78 MHz) by approximately 20 dB. That is, the frequency characteristics based on the combination resonance function as a filter for attenuating harmonics, errors caused by the harmonics can be reduced, and the measurement accuracy can be enhanced.

Figure 5:
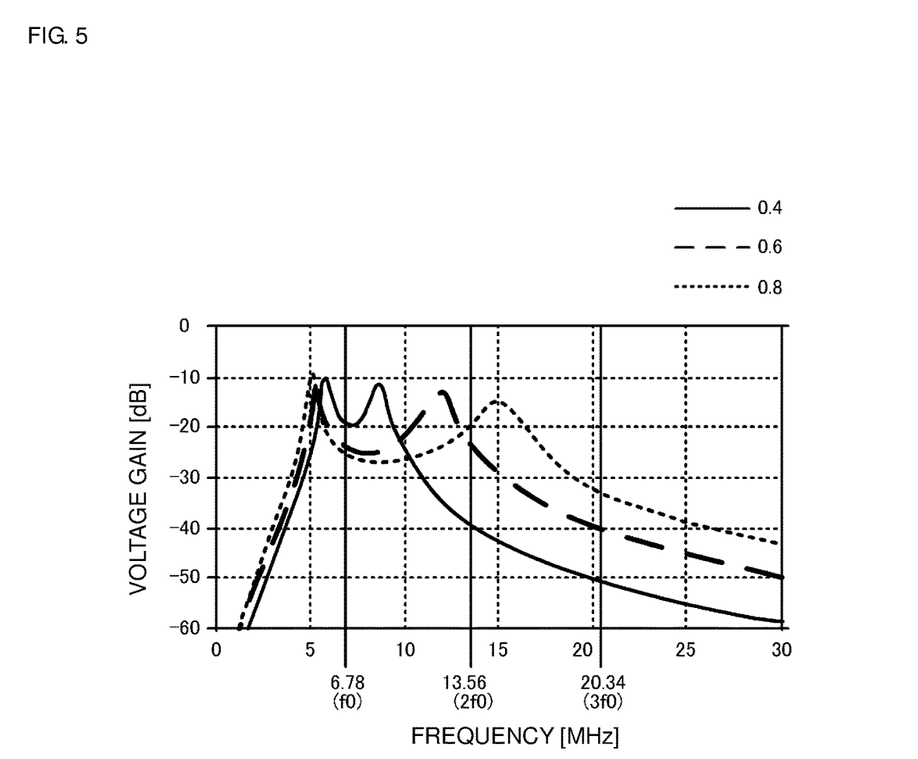
FIG. 5 illustrates frequency characteristics of the voltage gain for different coupling coefficients.

The combination resonant frequencies can be set by the degree of coupling between the primary-side inductor and the secondary-side inductor. FIG. 5 illustrates frequency characteristics of the voltage gain for different coupling coefficients. FIG. 5 illustrates frequency characteristics when the coupling coefficient is 0.4, 0.6, and 0.8. This drawing reveals that when the coupling coefficient is larger, the resonant frequency on a higher frequency side of the combination resonant frequencies is higher. With this, higher voltage gains at harmonic frequencies (second-order harmonic 2$f_0$ and third-order harmonic 3$f_0$) are also revealed.

Figure 6:
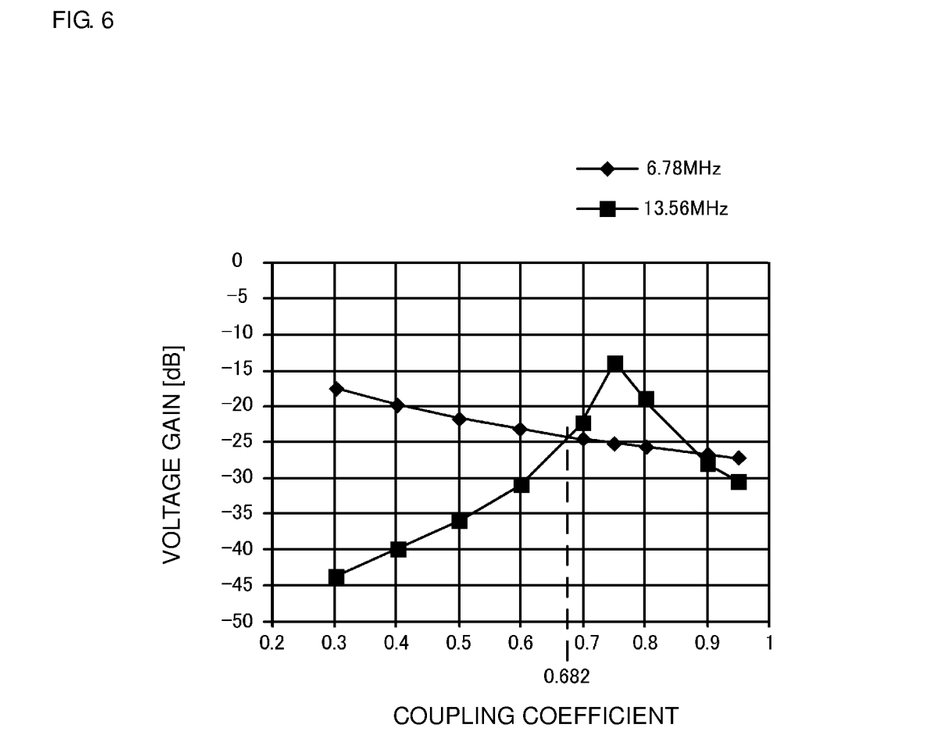
FIG. 6 illustrates relations of the voltage gain to the coupling coefficient.
Figure 7:
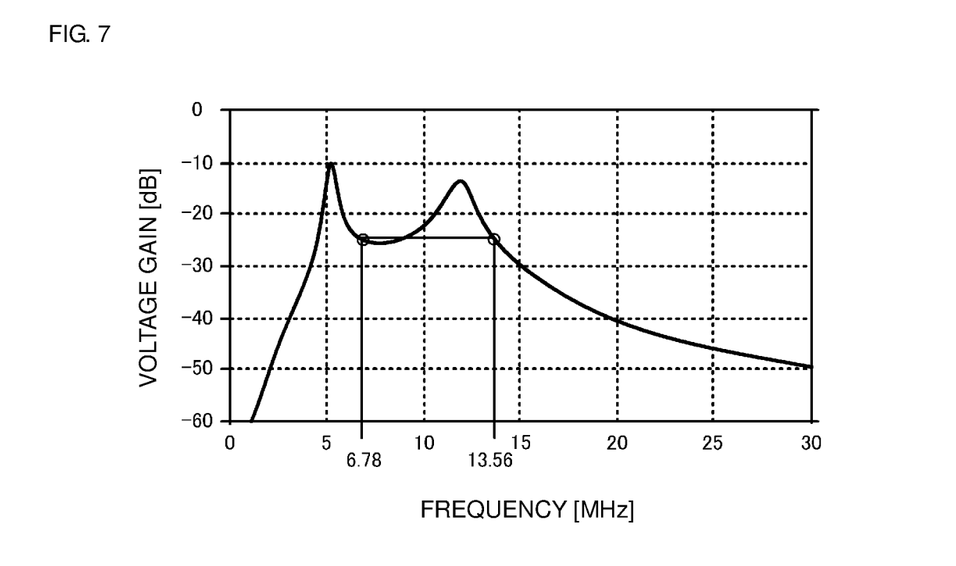
FIG. 7 illustrates frequency characteristics of the voltage gain when the coupling coefficient is 0.682.

FIG. 6 illustrates relations of the voltage gain to the coupling coefficient. FIG. 7 illustrates frequency characteristics of the voltage gain when the coupling coefficient is 0.682. As can be seen from these drawings, when the coupling coefficient is approximately 0.682, the voltage gain at the fundamental (6.78 MHz) and the voltage gain at the second-order harmonic (13.56 MHz) substantially match.

That is, the coupling coefficient between the primary-side inductor and the secondary-side inductor may preferably be set at a value smaller than 0.682 such that the voltage gain at the fundamental (6.78 MHz) is higher than the voltage gain at the second-order harmonic (13.56 MHz).

Therefore, the voltage detection circuit 1 can have a high sensitivity to detect the voltage on the secondary side by increasing the output voltage of the secondary-side resonant circuit 12 by using resonance. Thus, it is not necessary to include a voltage amplifying circuit after the secondary-side resonant circuit 12 in order to increase the detection sensitivity. Because the detection sensitivity is high, the input voltage into the primary-side resonant circuit 11 may be low, and the impedance of each of the capacitors C41 and C42 can be increased. Hence, when the capacitors C41 and C42 are connected, the effects on the alternating-current voltage occurring in the power transmission lines 2A and 2B or the alternating current flowing in the power transmission lines 2A and 2B can be reduced.

Moreover, the use of resonance enables extracting only the fundamental component even if the waveform of the alternating-current voltage occurring in the power transmission lines 2A and 2B is distorted. Accordingly, the accuracy of detecting the voltage in the fundamental component by the voltage detection circuit 1 can be increased.

In the present embodiment, the voltage detection circuit 1 includes the primary-side resonant circuit 11 and the secondary-side resonant circuit 12, which can resonate in combination. The voltage detection circuit 1 may have other configurations. For example, the voltage detection circuit 1 may not include the capacitor C1, and thus the primary-side resonant circuit 11 may not be formed. In this case, only the inductor L1 is disposed between the capacitors C41 and C42. This configuration can also achieve high detection sensitivity by the secondary-side resonant circuit 12.

In the circuit diagram of the voltage detection circuit 1 illustrated in FIG. 1, the rectifying and smoothing circuit is disposed after the secondary-side resonant circuit 12, and the voltage detector 13 detects a direct-current voltage. The voltage detector 13 may directly detect an alternating-current voltage output from the secondary-side resonant circuit 12, and the differential voltage VAC in the power transmission lines 2A and 2B may be measured from that detection.

The voltage detection circuit 1 may include neither the capacitor C41 nor C42. In this case, a capacitor for voltage division may be connected between the voltage detection circuit and each of the power transmission lines 2A and 2B such that the voltage detection circuit is disposed between the two capacitors.

In the present embodiment, the case where the voltage detection circuit 1 is disposed between the two power transmission lines 2A and 2B and when it detects a differential voltage is described. The voltage detection circuit 1 may be disposed between a power transmission line and a reference potential (ground) so as to detect the potential of the power transmission line from the reference potential.

The rectifier circuit is not limited to the configuration illustrated in FIG. 1. Variations of the rectifier circuit are described below.

FIGS. 8(A), 8(B), 9(A), and 9(B) illustrate variations of the rectifier circuit.

Figure 8A:
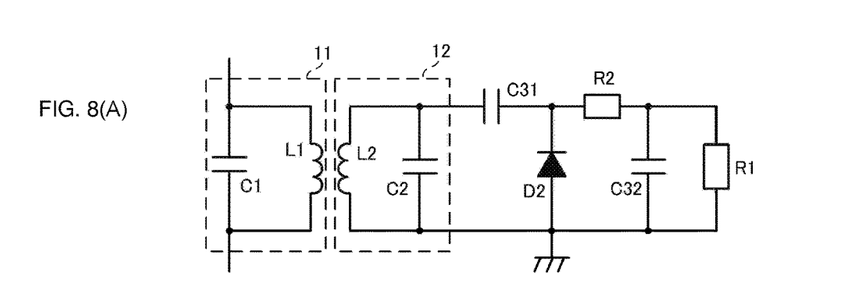
FIGS. 8(A) and 8(B) illustrate variations of a rectifier circuit.
Figure 8B:
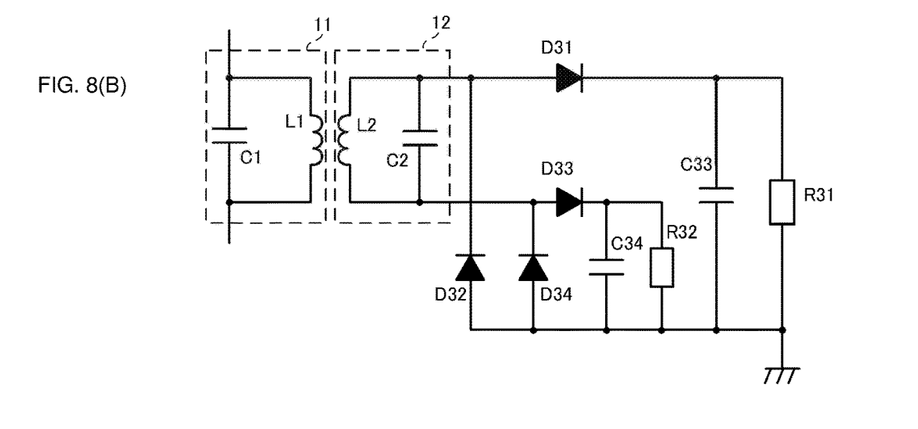

The rectifier circuit illustrated in FIG. 8(A) includes capacitors C31 and C32, a diode D2, and a resistor R2. The rectifier circuit illustrated in FIG. 8(B) includes a rectifier circuit including diodes D31 and D34 and a capacitor C33 and a rectifier circuit including diodes D32 and D33 and a capacitor C34. In this case, each of half waves of an alternating-current voltage output from the secondary-side resonant circuit 12 can be individually detected by using a voltage across each of loads R31 and R32.

Figure 9A:
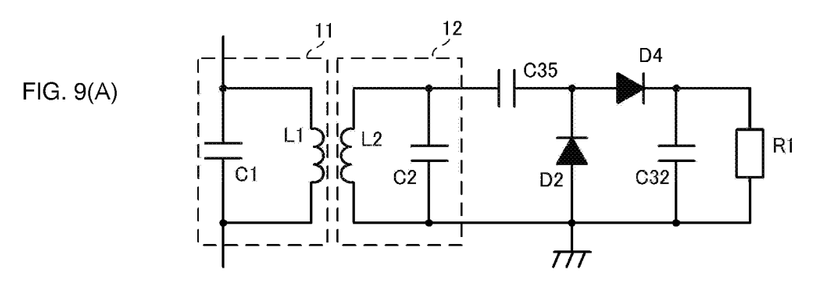
FIGS. 9(A) and 9(B) illustrate variations of the rectifier circuit.
Figure 9B:
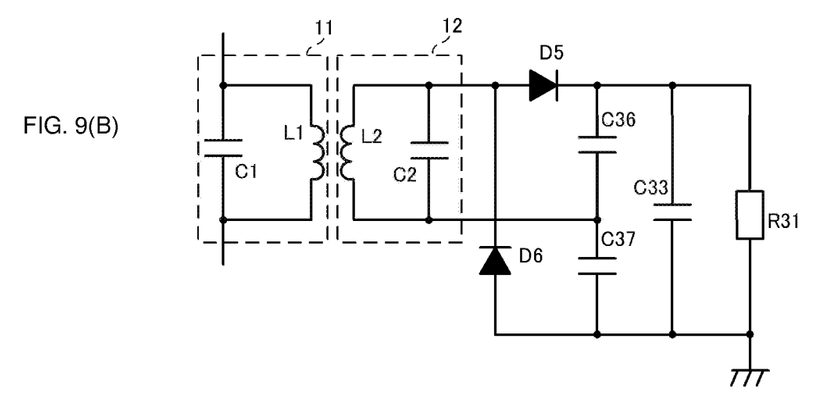

The rectifier circuit illustrated in FIG. 9(A) is a half-wave voltage doubler rectifier circuit that outputs a double rectified voltage and includes capacitors C35 and C32 and diodes D2 and D4. The rectifier circuit illustrated in FIG. 9(B) is a full-wave voltage doubler rectifier circuit that outputs a double rectified voltage and includes capacitors C33, C36, and C37 and diodes D5 and D6.

Second Embodiment

Figure 10:
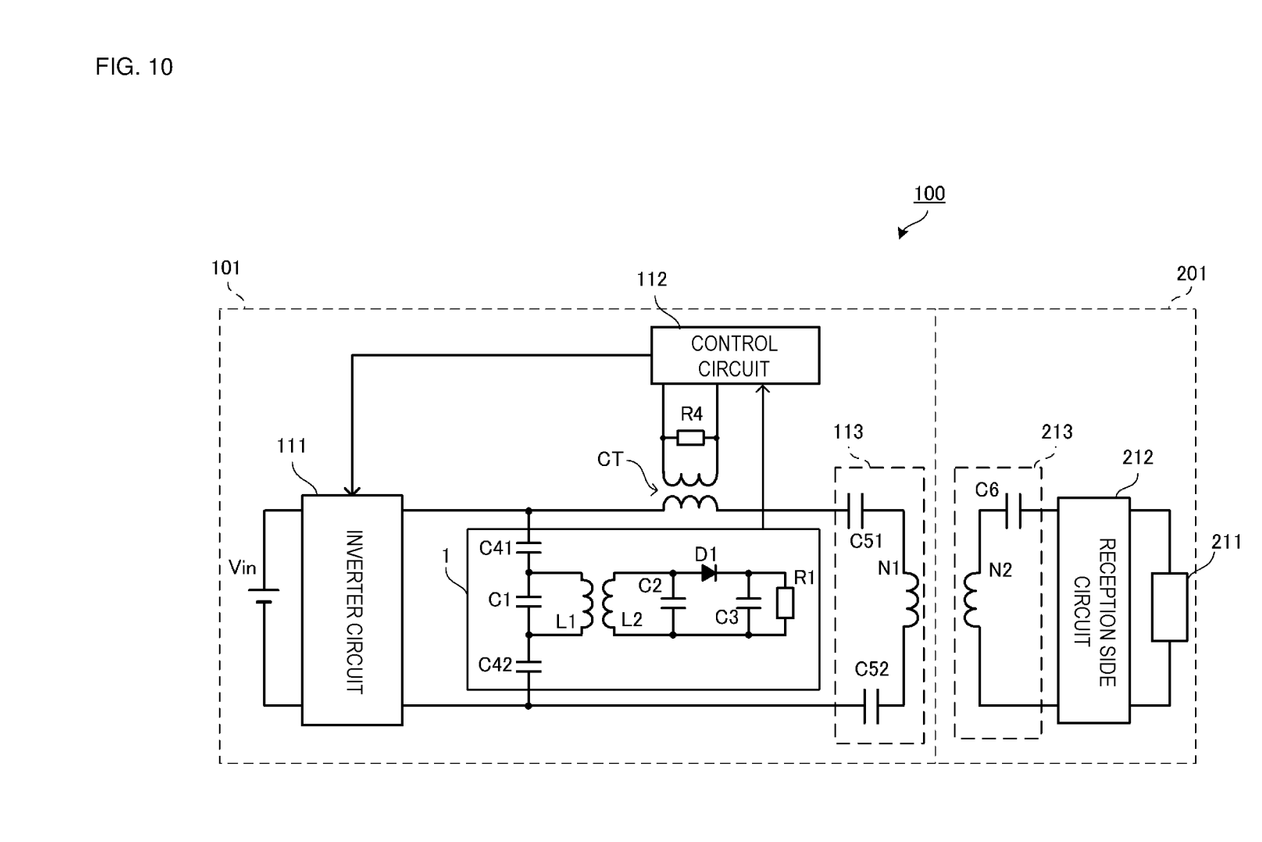
FIG. 10 is a circuit diagram of a power transmission system according to a second embodiment.

FIG. 10 is a circuit diagram of a power transmission system 100 according to a second embodiment.

The power transmission system 100 includes a power transmission device 101 including the voltage detection circuit 1 according to the first embodiment and a power reception device 201. The power reception device 201 includes a load circuit 211. The load circuit 211 includes a charging circuit and a secondary battery. The secondary battery may be detachable from the power reception device 201. One example of the power reception device 201 may be portable electronic equipment including that secondary battery. Examples of the portable electronic equipment may include a cellular phone, personal digital assistant (PDA), portable audio player, notebook personal computer, and digital camera. The power transmission device 101 is a charging stand for charging the secondary battery in the power reception device 201 placed thereon.

The power transmission device 101 includes a direct-current power source Vin that outputs a direct-current voltage. The direct-current power source Vin is an AC adapter connectable to mains electricity. The direct-current power source Vin is connected to an inverter circuit 111 and a transmission-side resonant coupling portion 113 in sequence. The inverter circuit 111 converts a direct-current voltage into an alternating-current voltage. The inverter circuit may include a filter circuit configured to remove harmonic components and high frequency components higher than the power transmission frequency. The transmission-side resonant coupling portion 113 includes a primary coil N1 and capacitors C51 and C52. The primary coil N1 is an example of "power transmission coupling portion" according to the present disclosure.

The power transmission device 101 includes a control circuit 112. The control circuit 112 performs switching control on the inverter circuit 111 at an optimal switching frequency at the time of transmitting power from the power transmission device 101 to the power reception device 201. The control circuit 112 detects the status of the side on which the transmission-side resonant coupling portion 113 is disposed. The control circuit 112 is described later.

The power reception device 201 includes a reception-side resonant coupling portion 213. The reception-side resonant coupling portion 213 includes a secondary coil N2 and a capacitor C6. The secondary coil N2 is magnetic-field coupled to the primary coil N1 in the transmission-side resonant coupling portion 113 in the power transmission device 101. Through this coupling, power is wirelessly transmitted from the power transmission device 101 to the power reception device 201. The secondary coil N2 is an example of "power reception coupling portion" according to the present disclosure.

The reception-side resonant coupling portion 213 is connected to a reception side circuit 212. The reception side circuit 212 rectifies and smoothes a voltage induced in the secondary coil N2, converts it into a stabilized predetermined voltage, and supplies it to the load circuit 211. The reception side circuit 212 is an example of "rectifying and smoothing circuit" according to the present disclosure.

Figure 11:
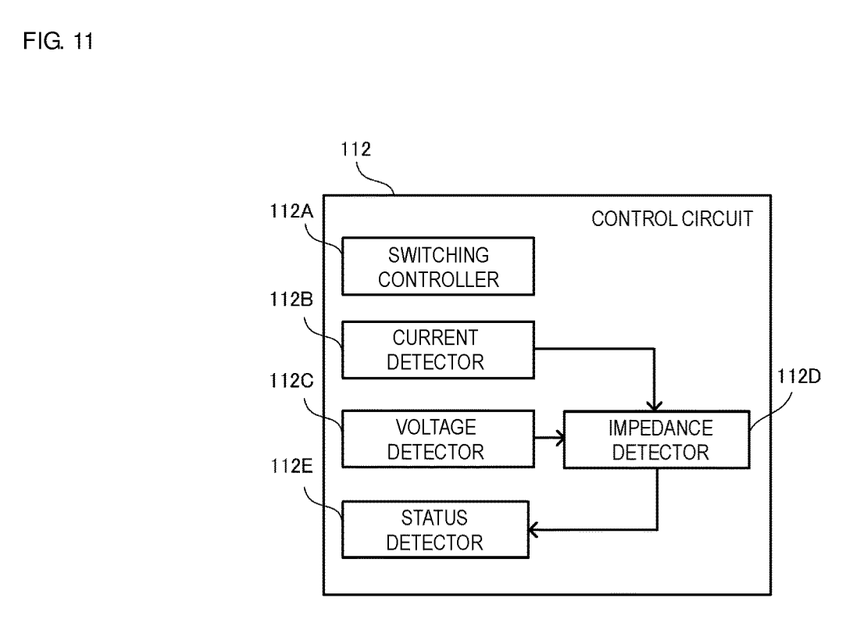
FIG. 11 is a block diagram that illustrates functions of a control circuit.

The control circuit 112 is described in detail below. FIG. 11 is a block diagram that illustrates functions of the control circuit 112. The control circuit 112 includes a switching controller 112A, a current detector 112B, a voltage detector 112C, an impedance detector 112D, and a status detector 112E.

The switching controller 112A performs switching control on the inverter circuit 111 at a predetermined switching frequency (for example, using a high frequency, such as 6.78 MHz or 13.56 MHz in the industrial, scientific and medical (ISM) band). The constants in the resonant circuits are set such that the resonant frequency of each of the transmission-side resonant coupling portion 113 and the reception-side resonant coupling portion 213 is close to the switching frequency.

The current detector 112B detects the magnitude of the alternating current output from the inverter circuit 111. As illustrated in FIG. 10, a current transformer CT and a resistor R4 are disposed on a power transmission line between the inverter circuit 111 and the transmission-side resonant coupling portion 113. The rectifying and smoothing circuit (not illustrated) is connected to both ends of the resistor R4. The current detector 112B receives a direct-current voltage proportional to the magnitude of the voltage across the resistor R4. The current detector 112B detects the magnitude of the alternating current output from the inverter circuit 111.

In place of the current transformer CT, a known impedance may be directly connected, the current detector 112B may detect a voltage across the impedance, and the magnitude of the alternating current may be obtained from that detection. The magnitude of the alternating current described here is any value that does not include phase information, such as amplitude or root-mean-square (RMS) value.

The voltage detector 112C detects the magnitude of the alternating-current voltage output from the inverter circuit 111. As illustrated in FIG. 10, the voltage detection circuit 1 described in the first embodiment is disposed on the output side of the inverter circuit 111. The voltage detection circuit 1 detects the voltage across the load R1 and detects the magnitude of the differential voltage from the voltage across the load R1. The magnitude of the differential voltage detected by the voltage detection circuit 1 is the magnitude of the alternating-current voltage output from the inverter circuit 111. The voltage detector 112C receives the magnitude of the differential voltage detected by the voltage detection circuit 1, that is, the magnitude of the alternating-current voltage output from the inverter circuit 111. The voltage detector 112C detects the magnitude of the alternating-current voltage output from the inverter circuit 111.

As described in the first embodiment, because the voltage detection sensitivity can be enhanced by the voltage detection circuit 1, the impedance of each of the capacitors C41 and C42 can be increased. Thus, the effects on the signal line between the inverter circuit 111 and the transmission-side resonant coupling portion 113 can be reduced, and the power transmission efficiency is not decreased. Even when the voltage applied to the transmission-side resonant coupling portion 113 is a voltage between differential lines (balanced lines), it is not necessary to connect to the reference potential (ground) in order to detect the voltage. Moreover, because the voltage detection circuit 1 uses combination resonance, the magnitude of the alternating-current voltage from the inverter circuit 111 can be detected over a wide frequency range with stability.

The impedance detector 112D detects an input impedance from the magnitude of the alternating current detected by the current detector 112B and the magnitude of the alternating-current voltage detected by the voltage detector 112C. The input impedance is an impedance as seen from the inverter circuit 111 to the side on which the transmission-side resonant coupling portion 113 is disposed and includes the transmission-side resonant coupling portion 113.

The status detector 112E detects the status of the side on which the transmission-side resonant coupling portion 113 is disposed from the input impedance detected by the impedance detector 112D. As an example of detecting the status, a method for detecting an abnormal condition is described below. The method for detecting an abnormal condition is merely an example and is not limited to that example.

The status detector 112E retains (stores) an impedance range at which the status is assumed to be a normal condition. The status detector 112E compares a calculated input impedance with the stored impedance range for the normal condition and determines whether the side on which the transmission-side resonant coupling portion 113 is disposed is in an abnormal condition.

If the status detector 112E determines that the side on which the transmission-side resonant coupling portion 113 is disposed is in an abnormal condition, for example, if a foreign object is on the power transmission device 101, the control circuit 112 may decrease the transmitted power or stop the power transmission operation, for example. The control circuit 112 may indicate an anomaly by turning on a lamp, generating an audible alarm, or the like.

Statuses other than an abnormal condition, such as whether the power reception device 201 is placed on the power transmission device 101 or not, where it is placed, or how the load fluctuates, can be similarly detected by an input impedance value or its fluctuating state. If the power reception device 201 is displaced, because the resonant frequencies of the transmission-side resonant coupling portion 113 and the reception-side resonant coupling portion 213 are displaced, the power transmission efficiency decreases, the amplitudes of the current and voltage rise or heat is generated. In that case, the transmitted power can be reduced for safety.

As described above, the power transmission device 101 can detect the alternating-current voltage from the inverter circuit 111 by means of the voltage detection circuit 1 with high sensitivity and can detect it over a wide frequency range with stability. Thus, it can also have a high accuracy of detecting an input impedance and can detect the status of the side on which the transmission-side resonant coupling portion 113 is disposed with high accuracy.

The current detector 112B and voltage detector 112C may detect an alternating current and an alternating-current voltage each including a phase without using the rectifying and smoothing circuit. The impedance detector 112D may detect an input impedance including a phase (R+jX) by high-speed computation processing. In this case, the status detector 112E may detect the status of the side on which the transmission-side resonant coupling portion 113 is disposed from, for example, determination whether in the calculated input impedance, the real part R exceeds a threshold value or the imaginary part X differs from an input impedance for a normal condition.

In the present embodiment, the current detector 112B and the voltage detector 112C are included, an input impedance as seen to the side on which the transmission-side resonant coupling portion 113 is disposed is detected, and the status of the side on which the transmission-side resonant coupling portion 113 is disposed is detected. The status of the side on which the transmission-side resonant coupling portion 113 is disposed may be detected by using the alternating-current voltage detected from the voltage detector 112C alone. For example, if the output of the inverter circuit 111 is a current source or if the output voltage is not constant because of the effects of the output impedance of the inverter circuit 111 or the like, the status of the side on which the transmission-side resonant coupling portion 113 is disposed may be detected by the alternating-current voltage alone.

In the present embodiment, the power transmission system 100 transmits power by using magnetic-field coupling between the power transmission device 101 and power reception device 201. It can also conduct power transmission by using electric-field coupling or electromagnetic-field coupling (electric-field coupling and magnetic-field coupling).

In the present embodiment, the voltage detection circuit 1 is disposed immediately after the inverter circuit 111, and the voltage between the differential lines (balanced lines) is detected. The position of the voltage detection circuit 1 is not limited to that illustrated in FIG. 10, and the object to be measured is not limited to the voltage between the differential lines.

Figure 12A:
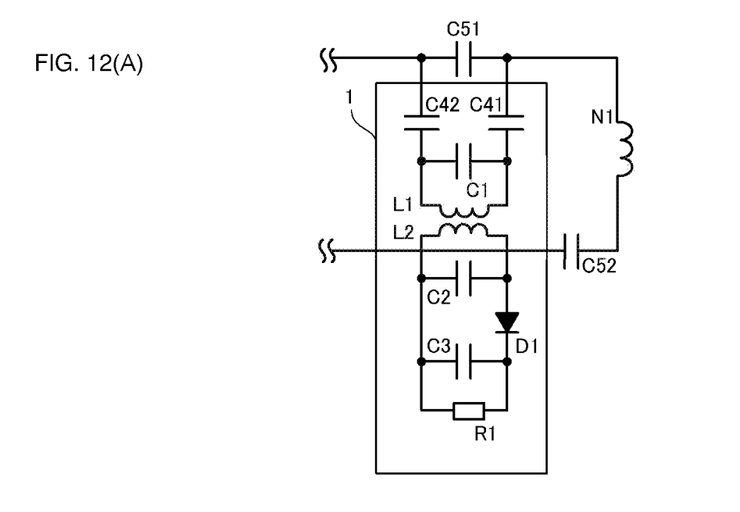
FIGS. 12(A) and 12(B) illustrate examples in which the voltage detection circuit is disposed in different positions.
Figure 12B:
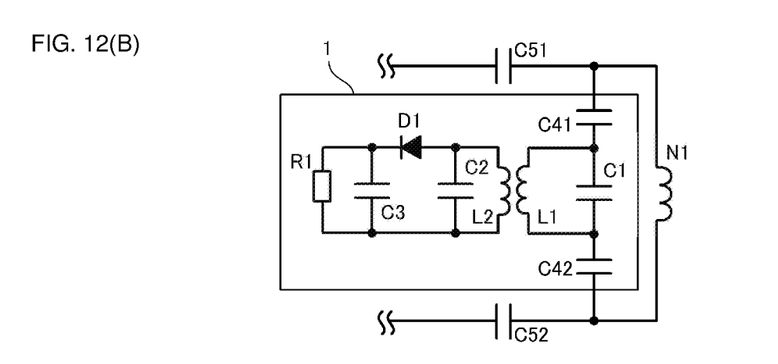

FIGS. 12(A) and 12(B) illustrate examples in which the voltage detection circuit 1 is disposed in different positions.

FIG. 12(A) illustrates an example in which the voltage detection circuit 1 is disposed across a capacitor C51. In this case, the voltage detection circuit 1 can be used in measuring a large current by detecting the voltage across the capacitor C51 and detecting a current. FIG. 12(B) illustrates an example in which the voltage detection circuit 1 is disposed across the primary coil N1. In this case, the voltage across the primary coil N1, to which the largest voltage is applied, can be measured.

The invention claimed is:

1. A voltage detection circuit comprising:
    a first input terminal configured to input a first alternating-current voltage and connected to a first transmission line connected between a power supply and a circuit of a load circuit side;
    a second input terminal configured to input a second alternating-current voltage and connected to a second transmission line connected between the power supply and the circuit of the load circuit side;
    a primary-side inductor connected to the first and the second input terminals;
    a secondary-side inductor magnetic-field coupled to the primary-side inductor;
    a secondary-side capacitor connected in parallel to the secondary-side inductor, the secondary-side capacitor and the secondary-side inductor forming a secondary-side resonant circuit of a power reception device;
    an output voltage detector contained in the power reception device and configured to detect an output voltage from a terminating end of the power reception device; and
    a primary-side capacitor connected in parallel to the primary-side inductor, wherein the primary-side inductor and the primary-side capacitor form a primary-side resonant circuit, at least a portion of the first input terminal and at least a portion of the second input terminal are not part of the first transmission line between the power supply and the circuit of the load circuit side, and the primary-side inductor is not part of the first transmission line between the power supply and the circuit of the load circuit side such that the primary-side inductor does not conduct power between the power supply and the circuit of the load circuit side.

2. The voltage detection circuit according to claim 1, wherein a resonant frequency of the secondary-side resonant circuit is a frequency of the first alternating-current voltage input from the first input terminal and the second alternating-current voltage input from the second input terminal.

3. The voltage detection circuit according to claim 1, wherein the resonant frequency of the primary-side resonant circuit is equal to the resonant frequency of the secondary-side resonant circuit.

4. The voltage detection circuit according to claim 3, wherein the frequency of the first alternating-current voltage input into the first input terminal and the frequency of the second alternating-current voltage input into the second input terminal are equal to or between two resonant frequencies defined by the primary-side resonant circuit and the secondary-side resonant circuit.

5. The voltage detection circuit according to claim 4, wherein a degree of coupling between the primary-side inductor and the secondary-side inductor is set such that the two resonant frequencies differ from a harmonic frequency.

6. The voltage detection circuit according to claim 1, further comprising an impedance element connected in series between each of the first and the second input terminals and the primary-side inductor.

7. The voltage detection circuit according to claim 6, wherein the impedance element is a capacitor.

8. A power transmission device comprising a power transmission coupling portion and transmitting power to a power reception device by causing a power reception coupling portion included in the power reception device and the power transmission coupling portion to be coupled to each other by at least one of electric fields and magnetic fields, the power transmission device further comprising:

an inverter circuit configured to convert a direct-current voltage into an alternating-current voltage and output the alternating-current voltage to the power transmission coupling portion;

a resonant circuit including the power transmission coupling portion and disposed between the inverter circuit and the power transmission coupling portion;

a voltage detection circuit comprising:

a pair of input terminals configured to input an alternating-current voltage;

a primary-side inductor connected to the pair of input terminals;

a secondary-side inductor magnetic-field coupled to the primary-side inductor;

a secondary-side capacitor connected in parallel to the secondary-side inductor, the secondary-side capacitor and the secondary-side inductor forming a secondary-side resonant circuit; and an output voltage detector configured to detect an output voltage from the secondary-side resonant circuit, the voltage detection circuit disposed between the inverter circuit and the power transmission coupling portion; and a status detector configured to detect a status of a side on which the power transmission coupling portion is disposed based on the voltage detected by the voltage detection circuit.

9. The power transmission device according to claim 8, further comprising an impedance detector configured to detect an impedance as seen from the inverter circuit to the power transmission coupling portion based on the voltage detected by the voltage detection circuit, wherein the status detector is configured to detect the status of the side on which the power transmission coupling portion is disposed on the basis of the impedance detected by the impedance detector.

10. The power transmission device according to claim 9, wherein the voltage detection circuit is configured to detect a differential voltage.

11. The power transmission device according to claim 8, wherein the power transmission coupling portion is a coil magnetic-field coupled to the power reception coupling portion.

12. A power transmission system comprising:

the power transmission device according to claim 8; and the power reception device including the power reception coupling portion and a rectifying and smoothing circuit, the power reception coupling portion being coupled to the power transmission coupling portion by at least one of electric fields and magnetic fields, the rectifying and smoothing circuit being configured to rectify and smooth a voltage induced in the power reception coupling portion and output the rectified and smoothed voltage to a load.

* * * * *